US009396929B2

(12) United States Patent
Hirose et al.

(10) Patent No.: US 9,396,929 B2
(45) Date of Patent: Jul. 19, 2016

(54) METHOD OF MANUFACTURING A SEMICONDUCTOR DEVICE, SUBSTRATE PROCESSING APPARATUS AND RECORDING MEDIUM

(71) Applicants: HITACHI KOKUSAI ELECTRIC INC., Tokyo (JP); L'AIR LIQUIDE-SOCIETE ANONYME POUR L'ETUDE ET L'EXPLOITATION DES PROCEDES GEORGES CLAUDE, Paris (FR)

(72) Inventors: Yoshiro Hirose, Toyama (JP); Norikazu Mizuno, Toyama (JP); Kazutaka Yanagita, Tsukuba (JP); Katsuko Higashino, Newark, DE (US)

(73) Assignees: HITACHI KOKUSAI ELECTRIC INC., Tokyo (JP); L'AIR LIQUIDE, SOCIETE ANONYME POUR L'ETUDE ET L'EXPLOITATION DES PROCEDES GEORGES CLAUDE, Paris (FR)

( * ) Notice: Subject to any disclaimer, the term of this patent is extended or adjusted under 35 U.S.C. 154(b) by 0 days.

(21) Appl. No.: 14/021,549

(22) Filed: Sep. 9, 2013

(65) Prior Publication Data

US 2014/0080318 A1    Mar. 20, 2014

(30) Foreign Application Priority Data

Sep. 14, 2012 (JP) ................................. 2012-203679

(51) Int. Cl.
*H01L 21/46* (2006.01)
*C23C 16/44* (2006.01)
(Continued)

(52) U.S. Cl.
CPC .......... *H01L 21/02255* (2013.01); *C23C 16/24* (2013.01); *C23C 16/45527* (2013.01); *C23C 16/45546* (2013.01); *C23C 16/52* (2013.01);
(Continued)

(58) Field of Classification Search
USPC ......... 427/255.28, 255.39, 255.391, 255.393; 556/51, 413
See application file for complete search history.

(56) References Cited

U.S. PATENT DOCUMENTS

2006/0160288 A1    7/2006 Leith et al.
2008/0079111 A1*   4/2008 Clark ..................... C23C 16/308
                                                      257/506

(Continued)

FOREIGN PATENT DOCUMENTS

JP     2008-527738 A      7/2008
JP     2012-138501 A      7/2012
WO     2006/078354 A2     7/2006
WO  WO 2011/123792 A2    10/2011

OTHER PUBLICATIONS

Jan. 22, 2016 Office Action issued in Japanese Application No. 2012-203679.

*Primary Examiner* — Pamela E Perkins
(74) *Attorney, Agent, or Firm* — Oliff PLC (57) ABSTRACT

Provided are: forming a thin film made of a specific element alone on a substrate by performing a specific number of times a cycle of: supplying a first source to the substrate, the first source containing the specific element and a halogen-group; and supplying a second source to the substrate, the second source containing the specific element and an amino-group, and having amino-group-containing ligands whose number is two or less in its composition formula and not more than the number of halogen-group-containing ligands in the composition formula of the first source.

15 Claims, 4 Drawing Sheets (51) Int. Cl.
  *H01L 21/02* (2006.01)
  *H01L 21/67* (2006.01)
  *C23C 16/24* (2006.01)
  *C23C 16/455* (2006.01)
  *C23C 16/52* (2006.01)

(52) U.S. Cl.
  CPC ...... *H01L 21/0262* (2013.01); *H01L 21/02532* (2013.01); *H01L 21/67011* (2013.01)

(56) References Cited

U.S. PATENT DOCUMENTS

| | | | |
|---|---|---|---|
| 2009/0035464 A1* | 2/2009 | Sato | C07C 215/08 427/255.28 |
| 2011/0223320 A1* | 9/2011 | Song | C23C 16/405 427/79 |
| 2012/0164842 A1 | 6/2012 | Watanabe et al. | |
| 2013/0078376 A1* | 3/2013 | Higashino et al. | 427/255.39 |

* cited by examiner

METHOD OF MANUFACTURING A SEMICONDUCTOR DEVICE, SUBSTRATE PROCESSING APPARATUS AND RECORDING MEDIUM

BACKGROUND

1. Technical Field

The present invention relates to a method of manufacturing a semiconductor device including forming a thin film on a substrate, a substrate processing apparatus and a recording medium.

2. Description of Related Art

As one step of a manufacturing step of a semiconductor device, there is provided a step of forming a thin film on a substrate in some cases, such as a silicon oxide film (SiO film) or a silicon nitride film (SiN film) containing a specific element such as silicon (Si) for example. The SiO film is excellent in insulation property and low dielectric property, and is generally used as an insulating film and an interlayer film. Also, the SiN film is excellent in insulation property, corrosion durability, dielectric property, and film stress controllability, etc., and is generally used as an insulating film, a mask film, an electric charge accumulation film, and a stress control film. Further, the following technique is also known: namely a technique of forming the thin film such as a silicon carbonitride film (SiCN film), a silicon oxycarbonitride film (SiOCN film), and a silicon oxycarbide film (SiOC film), etc., by adding carbon (C) into these thin films. By adding carbon into the thin film, wet etching durability of the thin film against hydrogen fluoride (HF) can be improved. Further, by adding carbon into the thin film, a dielectric constant and a refractive index of the thin film can be changed, so that the thin film with carbon added thereto can be utilized as an optical function film, etc., having a different refractive index from the refractive index of the neighboring film.

In recent years, with a miniaturization and a diversification of a semiconductor device, a demand for a lower temperature of a film formation temperature during formation of the thin film, has been increased. Although a pursuit for the lower temperature of the film formation temperature has been briskly performed, the object is not sufficiently achieved at present. For example, it is conventionally difficult to perform film formation processing in a low temperature zone of less than 500° C., which is applied to a silicon film (Si film) using a monosilane ($SiH_4$) gas or a disilane ($Si_2H_6$) gas.

Regarding the wet etching durability against HF, the SiN film and the SiCN film have a higher durability than the durability of the SiO film, and the Si film has a further higher durability than the durability of the SiN film and the SiCN film. Namely, the Si film is the film having a largely different processability (for example, wet etching durability, etc.) from the processability of the SiO film, etc., and can be suitably used as the film for processing when performing processing to the SiO film, etc., (for example, the film for an etching mask, etc., when performing etching to the SiO film, etc., being an underlayer, using HF). At present, it is difficult to form the film having a largely different processability from the processability of the SiO film, etc., in the low temperature zone, and a type of such a film is limited. Accordingly, if the thin film containing a specific element like the Si film containing Si for example, can be formed in the low temperature zone, choice of the film for processing can be increased, and the choice of a processing method can also be increased.

Accordingly, an object of the present invention is to provide a method of manufacturing a semiconductor device, a substrate processing apparatus and a recording medium, capable of forming a thin film containing a specific element like a silicon film in a low temperature zone.

According to an aspect of the present invention, there is provided a method of manufacturing a semiconductor device, including, forming a thin film made of a specific element alone on a substrate by performing a specific number of times a cycle of:

supplying a first source to the substrate, the first source containing the specific element and a halogen-group; and supplying a second source to the substrate, the second source containing the specific element and an amino-group, and having amino-group-containing ligands whose number is two or less in its composition formula and not more than the number of halogen-group-containing ligands in the composition formula of the first source.

According to other aspect of the present invention, there is provided a substrate processing apparatus, including:

a processing chamber configured to house a substrate;

a first source supply system configured to supply a first source to the substrate in the processing chamber, the first source containing a specific element and a halogen-group;

a second source supply system configured to supply a second source to the substrate in the processing chamber, the second source containing the specific element and an amino-group, and having amino-group-containing ligands whose number is two or less in its composition formula and not more than the number of halogen-group-containing ligands in the composition formula of the first source; and a control part configured to control the first source supply system and the second source supply system, so as to perform processing of forming a thin film made of the specific element alone, on a substrate by performing a specific number of times a cycle of:

processing of supplying the first source to the substrate in the processing chamber; and processing of supplying the second source to the substrate in the processing chamber.

According to further other aspect of the present invention, there is provided a non-transitory computer-readable recording medium recording a program for making a computer execute a procedure of forming a thin film made of a specific element alone on a substrate by performing a specific number of times a cycle of:

a procedure of supplying a first source to the substrate in a processing chamber, the first source containing the specific element and a halogen-group; and a procedure of supplying a second source to the substrate in the processing chamber, the second source containing the specific element and an amino-group, and having amino-group-containing ligands whose number is two or less in its composition formula and not more than the number of halogen-group-containing ligands in the composition formula of the first source.

According to the present invention, there is provided a method of manufacturing a semiconductor device, a substrate processing apparatus and a recording medium, capable of forming a thin film containing a specific element like a silicon film in a low temperature zone.

DETAILED DESCRIPTION OF THE INVENTION

<An Embodiment of the Present Invention>

An embodiment of the present invention will be described hereafter, based on the drawings.

(1) Structure of a Substrate Processing Apparatus

Figure 1:
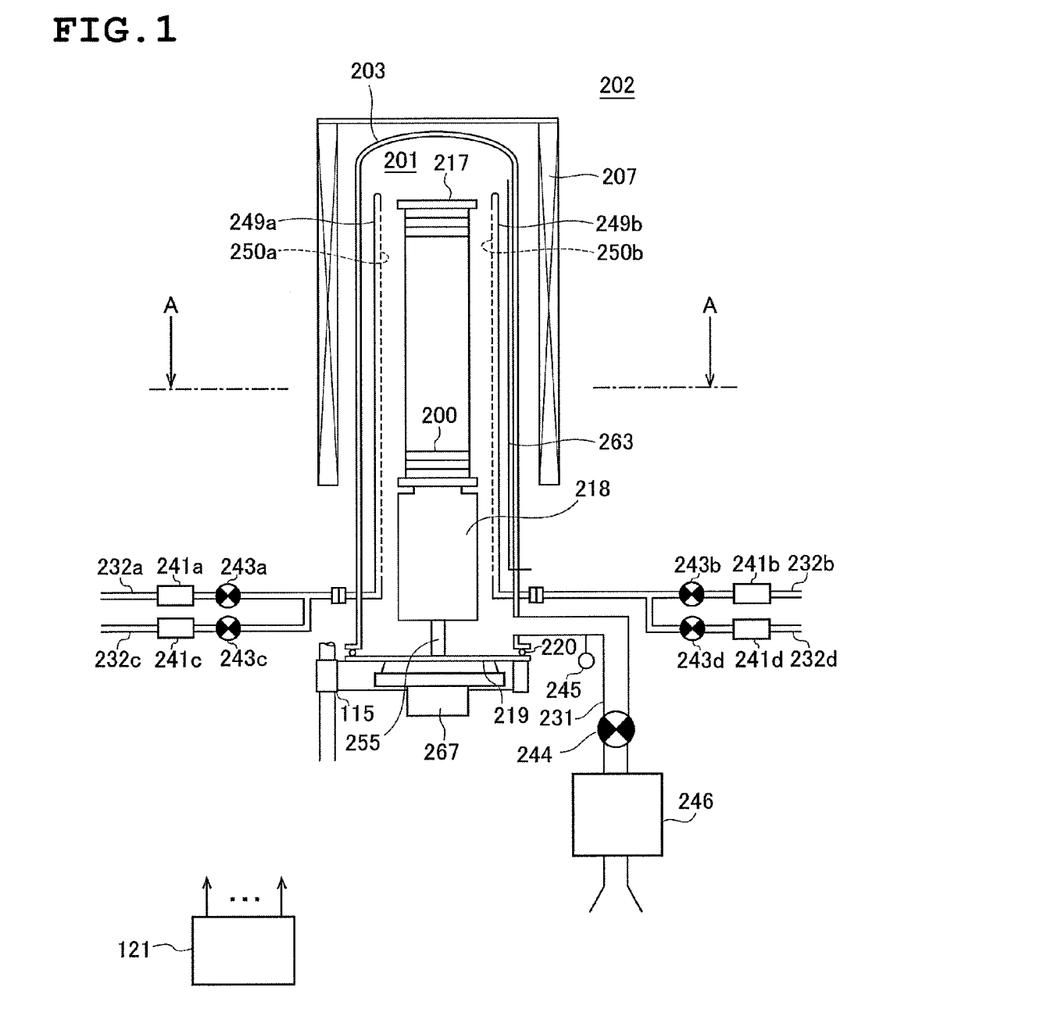
FIG. 1 is a schematic block diagram of a vertical type processing furnace of a substrate processing apparatus suitably used in this embodiment, and a vertical sectional view showing a processing furnace portion.
Figure 2:
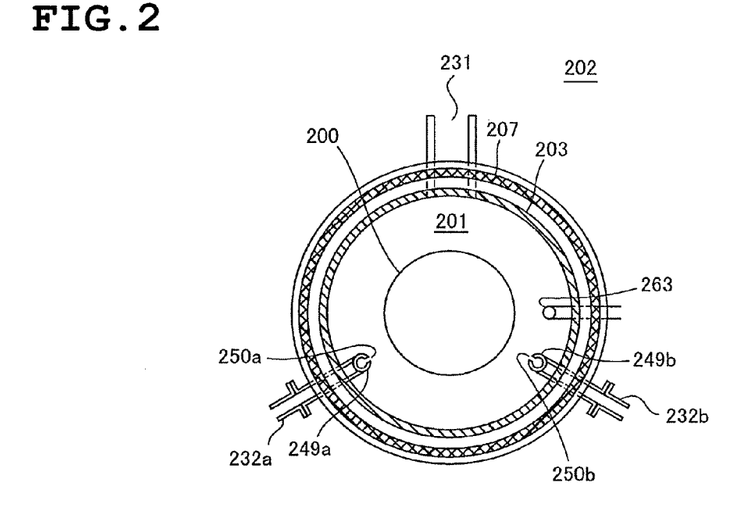
FIG. 2 is a schematic block diagram of the vertical type processing furnace of the substrate processing apparatus suitably used in this embodiment, and is a view showing the processing furnace portion taken along the line A-A of FIG. 1.

FIG. 1 is a schematic block diagram of a vertical type processing furnace of a substrate processing apparatus suitably used in this embodiment, and shows a processing furnace 202 portion in a vertical sectional view. FIG. 2 is a schematic block diagram of the vertical type processing furnace suitably used in this embodiment, and shows the processing furnace 202 portion taken along the line A-A of FIG. 1. The present invention is not limited to such a substrate processing apparatus, and can be suitably applied to a substrate processing apparatus having a single wafer type, Hot Wall type, Cold Wall type processing furnaces.

As shown in FIG. 1, the processing furnace 202 includes a heater 207 as a heating unit (heating mechanism). The heater 207 has a cylindrical shape, and is vertically installed on a heater base (not shown) as a holding plate by being supported thereby. The heater 207 also functions as an activation mechanism of activating a gas by heat as will be described later.

A reaction tube 203 constituting a reaction vessel (processing vessel) is disposed inside of the heater 207 concentrically with the heater 207. The reaction tube 203 is made of a heat-resistant material such as quartz ($SiO_2$) or silicon carbide (SiC), etc., for example, and is formed into a cylindrical shape, with an upper end closed and a lower end opened. A processing chamber 201 is formed in a cylinder hollow part of the reaction tube 203, so that wafers 200 being substrates, can be stored by a boat 217 in a state of being vertically arranged in multiple stages in a horizontal posture.

A first nozzle 249a and a second nozzle 249b are provided in the processing chamber 201 so as to pass through a lower part of the reaction tube 203. A first gas supply tube 232a and a second gas supply tube 232b are respectively connected to the first nozzle 249a and the second nozzle 249b. Thus, two nozzles 249a, 249b and two gas supply tubes 232a, 232b are provided on the reaction tube 203, so that a plurality of kinds of gases, two kinds of gases here, can be supplied into the processing chamber 201.

A metal manifold for supporting the reaction tube 203 may be provided in a lower part of the reaction tube 203, and each nozzle may be provided so as to pass through a side wall of the metal manifold. In this case, an exhaust tube 231 described later may further be provided in this metal manifold. In this case as well, the exhaust tube 231 may be provided not in the metal manifold, but in the lower part of the reaction tube 203. Thus, a furnace throat portion of the processing furnace 202 may be made of metal, and a nozzle, etc., may be attached to the metal furnace throat portion.

A mass flow controller (MFC) 241a being a flow rate control unit (flow rate control part) and a valve 243a being an open/close valve are provided on the first gas supply tube 232a sequentially from an upstream direction. Further, a first inert gas supply tube 232c is connected to a downstream side of the valve 243a of the first gas supply tube 232a. A mass flow controller 241c being the flow rate control unit (flow rate control part), and a valve 243d being the open/close valve are provided on the first inert gas supply tube 232c sequentially from the upstream direction. Further, the above-mentioned first nozzle 249a is connected to a tip part of the first gas supply tube 232a. The first nozzle 249a is provided in an arc-shaped space between an inner wall of the reaction tube 203 and the wafers 200, extending from a lower part to an upper part of the inner wall of the reaction tube 203, so as to rise toward an upper part of a stacking direction of the wafers 200. Namely, the first nozzle 249a is provided in a region horizontally surrounding a wafer arrangement region in which the wafers 200 are arranged, at a side part of the wafer arrangement region, along the wafer arrangement region. The first nozzle 249a is formed as an L-shaped long nozzle, with its horizontal part provided so as to pass through a lower side wall of the reaction tube 203, and with its vertical part provided so as to rise at least from one end side toward the other end side of the wafer arrangement region. Gas supply holes 250a for supplying gas, are provided on a side face of the first nozzle 249a. Each gas supply hole 250a is opened to face a center of the reaction tube 203, so that the gas can be supplied toward the wafers 200. A plurality of gas supply holes 250a are provided extending from a lower part to an upper part of the reaction tube 203, each of them having the same opening area and provided at the same opening pitch. A first gas supply system is mainly constituted of the first gas supply tube 232a, the mass flow controller 241a, and the valve 243a. The first nozzle 249a may be included in the first gas supply system. Also, a first inert gas supply system is mainly constituted of the first inert gas supply tube 232c, the mass flow controller 241c, and the valve 243c. The first inert gas supply system also functions as a purge gas supply system.

A mass flow controller (MFC) 241b being the flow rate control unit (flow rate control part), and a valve 243b being the open/close valve, are provided on the second gas supply tube 232b, sequentially from the upstream direction. Further, a second inert gas supply tube 232d is connected to a downstream side of the valve 243b of the second gas supply tube 232b. A mass flow controller 241d being the flow rate control unit (flow rate control part), and a valve 243d being the open/close valve are provided on the second inert gas supply tube 232d sequentially from the upstream direction. Further, the second nozzle 249b is connected to a tip end portion of the second gas supply tube 232b. The second nozzle 249b is provided in the arc-shaped space between the inner wall of the reaction tube 203 and the wafers 200, extending from the lower part to the upper part of the inner wall of the reaction tube 203, so as to rise toward the upper part of the stacking direction of the wafers 200. Namely, the second nozzle 249b is provided in the region horizontally surrounding the wafer arrangement region in which the wafers 200 are arranged, at the side part of the wafer arrangement region, along the wafer arrangement region. The second nozzle 249b is formed as an L-shaped long nozzle, with its horizontal part provided so as to pass through the lower side wall of the reaction tube 203, and with its vertical part provided so as to rise at least from one end side toward the other end side of the wafer arrangement region. Gas supply holes 250b for supplying gas, are provided on a side face of the second nozzle 249b. Each gas supply hole 250b is opened to face the center of the reaction tube 203, so that the gas can be supplied toward the wafers 200. A plurality of gas supply holes 250b are provided extending from the lower part to the upper part of the reaction tube 203, each of them having the same opening area and provided at the same opening pitch. A second gas supply system is mainly constituted of the second gas supply tube 232b, the mass flow controller 241b, and the valve 243b. The second nozzle 249b may be included in the second gas supply system. Also, a second inert gas supply system is mainly constituted of the second inert gas supply tube 232d, the mass flow controller 241d, and the valve 243d. The second inert gas supply system also functions as the purge gas supply system.

Thus, in the method of supplying gas according to this embodiment, gas is transferred through nozzles 249a, 249b disposed in an arc-shaped vertically long space defined by the inner wall of the reaction tube 203 and edge portions of the plurality of stacked wafers 200, and the gas is sprayed into the reaction tube 203 for the first time in the vicinity of the wafers 200 from the gas supply holes 250a, 250b which are opened on the nozzles 249a 249b respectively, so that the gas flows mainly in parallel to the surface of the wafers 200, namely in a horizontal direction. With this structure, the following effect can be obtained. Namely, the gas can be uniformly supplied to each wafer 200, and a film thickness of the thin film formed on each wafer 200 can be equalized. The gas flowing over the surfaces of the wafers 200, namely a remained gas after reaction flows toward an exhaust port, namely in a direction of the exhaust tube 231 described later. However, the direction of the flow of such a remained gas is suitably specified by a position of the exhaust port and is not limited to the vertical direction.

As a first source containing a specific element and a halogen-group, a chlorosilane-based source gas being a first source gas containing at least a silicon (Si) element and a chloro-group, is supplied from the first gas supply tube 232a into the processing chamber 201 through the mass flow controller 241a, the valve 243a, and the first nozzle 249a. Wherein, the chlorosilane-based source means a silane-based source having the chloro-group, and means the source containing at least silicon (Si) and chlorine (Cl). Namely, it can be said that the chlorosilane-based source called here, is one type of halide. In this specification, when using the term of the "source", the source means a case such as a "liquid source in a liquid state", a case such as a "source gas obtained by vaporizing the liquid source", and the both cases. Accordingly, in this specification, when the term of the "chlorosilane-based source" is used, the source means a case of a "chlorosilane-based source in the liquid state", a case of a "chlorosilane-based source gas", or the both cases. As the chlorosilane-based source gas, for example, a hexachlorodisilane ($Si_2Cl_6$, abbreviated as HCDS) gas can be used, having halogen-group-containing ligands (Cl) whose number is six in its composition formula (In one molecule). When the liquid source in the liquid state under normal temperature and pressure like the HCDS is used, the liquid source is vaporized by a vaporization system such as a vaporizer or a bubbler, etc., and is supplied as the source gas (HCDS gas).

As a second source containing the specific element and an amino-group (amine-group), an aminosilane-based source gas being the second source gas containing at least silicon (Si) element and the amino-group, is supplied into the processing chamber 201 through the mass flow controller 241b, the valve 243b, and the second nozzle 249b from the second gas supply tube 232b. Wherein, the aminosilane-based source means a silane-based source having the amino-group (this is also the silane-based source containing an alkyl-group such as a methyl-group, an ethyl-group, and a butyl-group, etc.), which is the source containing at least silicon (Si), carbon (C), and nitrogen (N). Namely, it can be said that the aminosilane-based source called here is an organic source, which is an organic aminosilane-based source. When using the "aminosilane-based source" in this specification, the aminosilane-based source includes a case of meaning the "aminosilane-based source in the liquid state", and a case of meaning the "aminosilane-based source gas", or a case of meaning the both cases. As the aminosilane-based source, the source having amino-group-containing ligands whose number is two or less in its composition formula (In one molecule) and not more than the number of the halogen-group-containing ligands in the composition formula of the chlorosilane-based source, can be used, and for example, monoaminosilane ($SiH_3R$) can be used, which is the source containing one amino-group in the composition formula (In one molecule). Wherein, R indicates the ligand, and indicates the amino-group in which one or two hydrocarbon-groups containing one or more carbon atoms (C) are coordinated in one nitrogen atom (N) (and which is obtained by substituting one or both H in the amino-group expressed by $NH_2$, with a hydrocarbon group containing one or more carbon atoms). When two hydrocarbon-groups constituting a part of the amino-group are coordinated in one N, the two hydrocarbon-groups may be the same hydrocarbon-groups, or may be different hydrocarbon-groups. Further, the hydrocarbon-group may include an unsaturated-bond such as a double-bond or a triple-bond, etc. Further, the amino-group may have a ring structure. For example, (ethylmethylamino)silane ($SiH_3[N(CH_3)(C_2H_5)]$) (dimethylamino)silane ($SiH_3[N(CH_3)_2]$), (diethylpiperidino)silane ($SiH_3[NC_5H_8(C_2H_5)_2]$), etc., can be used as $SiH_3R$. When using the liquid source in the liquid state under normal temperature and pressure like $SiH_3R$, the liquid source is vaporized by the vaporization system such as the vaporizer or the bubbler, etc., and is supplied as the source gas ($SiH_3R$ gas).

A nitrogen ($N_2$) gas is supplied into the processing chamber 201 from the inert gas supply tubes 232c, 232d, through the mass flow controllers 241c, 241d, valves 243c, 243d, gas supply tubes 232a, 232b, and nozzles 249a, 249b respectively.

For example, when the gas like the above-mentioned gas is flowed from each gas supply tube, a first source supply system for supplying the first source containing the specific element and the halogen-group, namely, a chlorosilane-based source gas supply system as the first source gas supply system is constituted by the first gas supply system. The chlorosilane-based source gas supply system is also simply called a chlorosilane-based source supply system. Further, a second source supply system for supplying the second source containing the specific element and the amino-group, namely an aminosilane-based source gas supply system as the second source gas supply system is constituted by the second gas supply system. The aminosilane-based source gas supply system is also simply called an aminosilane-based source supply system.

The exhaust tube 231 for exhausting the atmosphere in the processing chamber 201 is provided on the reaction tube 203. As shown in FIG. 2, the exhaust tube 231 is provided on a side opposed to the side where the gas supply holes 250a of the first nozzle 249a and the gas supply holes 250b of the second nozzle 249b are provided, namely on the opposite side to the gas supply holes 250a, 250b with the wafers 200 interposed between them, in cross-sectional view. Further, as shown in FIG. 1 in a vertical sectional view, the exhaust tube 231 is provided below the part where the gas supply holes 250a, 250b are provided. With this structure, the gas supplied in the vicinity of the wafers 200 in the processing chamber 201 from the gas supply holes 250a, 250b, flows in the horizontal direction, namely in parallel to the surface of the wafers 200, and thereafter flows downward and is exhausted from the exhaust tube 231. As described above, the gas flows mainly in the horizontal direction in the processing chamber 201.

A vacuum pump 246 as a vacuum-exhaust device is connected to the exhaust tube 231, through a pressure sensor 245 as a pressure detector (pressure detection part) for detecting a pressure in the processing chamber 201, and an APC (Auto Pressure Controller) valve 244 as a pressure adjuster (pressure adjustment part). The APC valve 244 is configured to perform vacuum-exhaust/stop of vacuum-exhaust in the processing chamber 201 by opening and closing the valve in a state of operating the vacuum pump 246, and further is configured to adjust the pressure in the processing chamber 201 by adjusting an opening degree of the valve in the state of operating the vacuum pump 246. An exhaust system is mainly constituted of the exhaust tube 231, the APC valve 244, and the pressure sensor 245. The vacuum pump 246 may be included in the exhaust system. The vacuum pump 246 is configured to perform vacuum-exhaust of the inside of the processing chamber 201 to a specific pressure (vacuum degree) by adjusting the opening degree of the APC valve 244 based on pressure information detected by the pressure sensor 245 in the state of operating the vacuum pump 246.

A seal cap 219 as a furnace throat lid member capable of air-tightly closing a lower end opening of the reaction tube 203, is provided in the lower part of the reaction tube 203. The seal cap 219 is configured to abut on the lower end of the reaction tube 203 from a vertical lower side. The seal cap 219 is made of metal such as stainless, etc., and is formed into a disc shape. An O-ring 220 as a seal member abutted on the lower end of the reaction tube 203, is provided on an upper surface of the seal cap 219. A rotation mechanism 267 for rotating a boat 217 as a substrate holding tool described later, is installed on an opposite side of the processing chamber 201 across the seal cap 219. A rotary shaft 255 of the rotation mechanism 267 is passed through the seal cap 219 and is connected to the boat 217. The rotation mechanism 267 is configured to rotate the wafers 200 by rotating the boat 217. The seal cap 219 is configured to be vertically elevated by a boat elevator 115 as an elevation mechanism vertically installed outside of the reaction tube 203. The boat elevator 115 is configured to load and unload the boat 217 into/from the processing chamber 201 by elevating the seal cap 219. Namely, the boat elevator 115 is configured as a transferring device (transferring mechanism) for transferring the boat 217 namely the wafers 200 into/from the processing chamber 201.

The boat 217 as a substrate supporting tool, is made of a heat-resistant material such as quartz and silicon carbide, etc., and is configured to support a plurality of wafers 200 in a horizontal posture, with centers thereof aligned, so as to be arranged in multiple stages. A heat insulating member 218 made of the heat-resistant material such as quartz and silicon carbide, etc., is provided in a lower part of the boat 217, so that a heat from the heater 207 is hardly transmitted to the seal cap 219 side. The heat-insulating member 218 may also be configured by a plurality of heat-insulating plates made of the heat-resistant material such as quartz and silicon carbide, etc., and a heat-insulating plate holder for supporting these heat-insulting plates in a horizontal posture in multiple stages.

A temperature sensor 263 as a temperature detector, is installed in the reaction tube 203, and by adjusting a power supply state to the heater 207 based on the temperature information detected by the temperature sensor 263, the temperature in the processing chamber 201 is set to have a desired temperature distribution. Similarly to the nozzles 249a and 249b, the temperature sensor 263 is formed into the L-shape, and is provided along the inner wall of the reaction tube 203.

Figure 3:
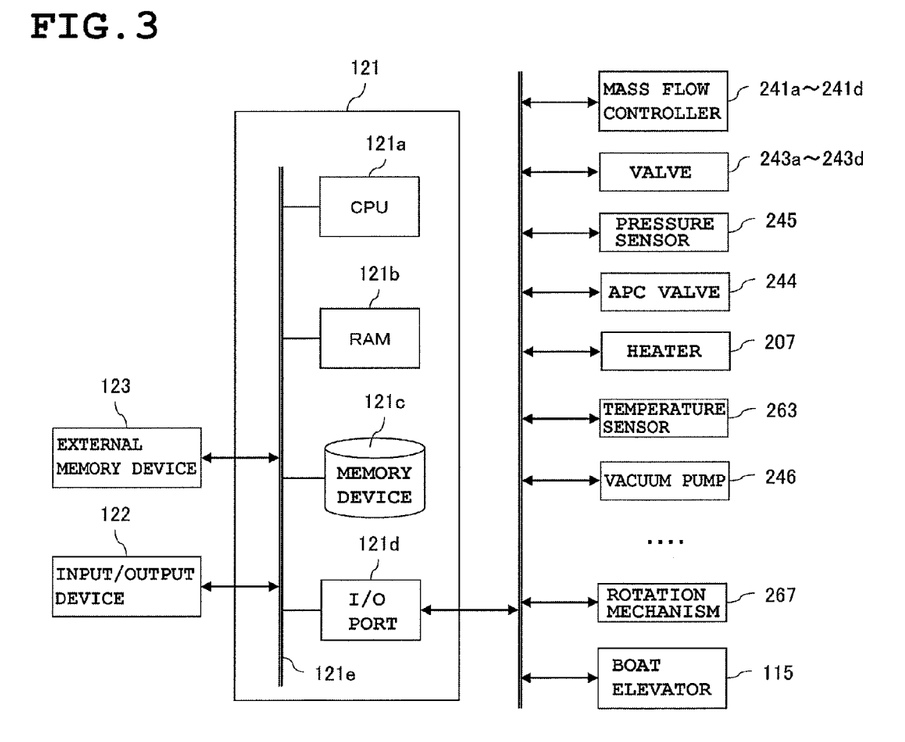
FIG. 3 is a schematic block diagram of a controller of the substrate processing apparatus suitably used in this embodiment.

As shown in FIG. 3, the controller 121 being the control part (control unit), is configured as a computer including CPU (Central Processing Unit) 121a, RAM (Random Access Memory) 121b, a memory device 121c, and I/O port 121d. The RAM 121b, the memory device 121c, and the I/O port 121d are configured to perform data exchange with CPU 121a via an internal bus 121e. An input/output device 122 configured as a touch panel, etc., is connected to the controller 121.

The memory device 121c includes a flash memory, HDD (Hard Disk Drive), etc., for example. A control program for controlling an operation of the substrate processing apparatus, and a process recipe, etc., indicating a procedure and a condition, etc., of substrate processing as will be descried later, are readably stored in the memory device 121c. The process recipe is a combination of recipes, so that each procedure in a substrate processing step described later is executed by the controller 121 to obtain a specific result, and functions as a program. The process recipe and the control program, etc., are generally simply called a program. When using the term of a program in this specification, the program means a case of including the process recipe alone, a case of including a control program alone, or a case including the both cases. The RAM 121b is configured as a memory area (work area) in which the program and data, etc., read by the CPU 121a are temporarily stored.

The I/O port 121d is connected to the above-mentioned mass flow controllers 241a, 241b, 241c, 241d, valves 243a, 243b, 243c, 243d, pressure sensor 245, APC valve 244, vacuum pump 246, heater 207, temperature sensor 263, rotation mechanism 267, boat elevator 115, etc.

The CPU 121a is configured to read and execute the control program from the memory device 121c, and is configured to read the process recipe from the memory device 121c according to an input, etc., of an operation command from the input/output device 122. Then, the CPU 121a is configured to control a flow rate adjustment operation of each kind of gas by the mass flow controllers 241a, 241b, 241c, 241d, an open/close operation of the valves 243a, 243b, 243c, 243d, an open/close operation of the APC valve 244, a pressure adjustment operation based on the pressure sensor 245 by the APC valve 244, a temperature adjustment operation of the heater 207 based on the temperature sensor 263, start/stop of the vacuum pump 246, a rotation speed adjustment operation of the rotation mechanism 267, and an elevating operation of the boat 217 by the boat elevator 115.

The controller 121 may be configured not only as a dedicated computer, but also as a general-purpose computer. For example, an external memory device 123 storing the above-mentioned program (for example, a magnetic tape, a magnetic disc such as a flexible disc and a hard disc, etc., an optical disc such as CD and DVD, etc., an optical magnetic disc such as MO, etc., and a semiconductor memory such as a USB memory and a memory card, etc.), is prepared, and by using the external memory device 123, the program is installed in the general-purpose computer, to thereby constitute the controller 121 according to this embodiment. A method for supplying the program to the computer, is not limited to a case of supplying it through the external memory device 123. For example, a communication method such as Internet and a dedicated line, etc., may be used, to thereby supply the program not through the external memory device 123. The memory device 121c and the external memory device 123 are configured as computer-readable recording media. They are also generally simply called recording media. When using the term of recording media in this specification, the recording media mean a case of including the memory device 121c alone, a case of including the external memory device 123 alone, or a case of including the both cases.

(2) Substrate Processing Step

Figure 4:
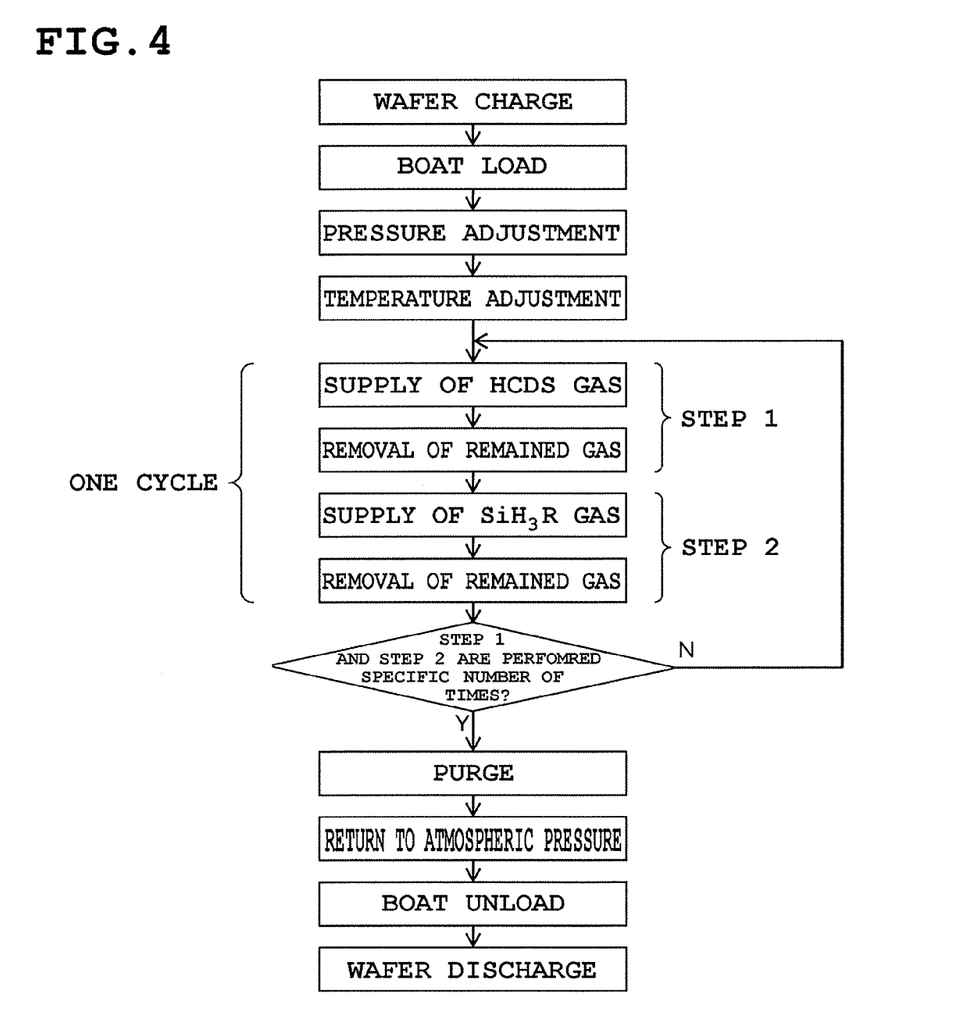
FIG. 4 is a view showing a film formation flow in a film formation sequence according to this embodiment.
Figure 5:
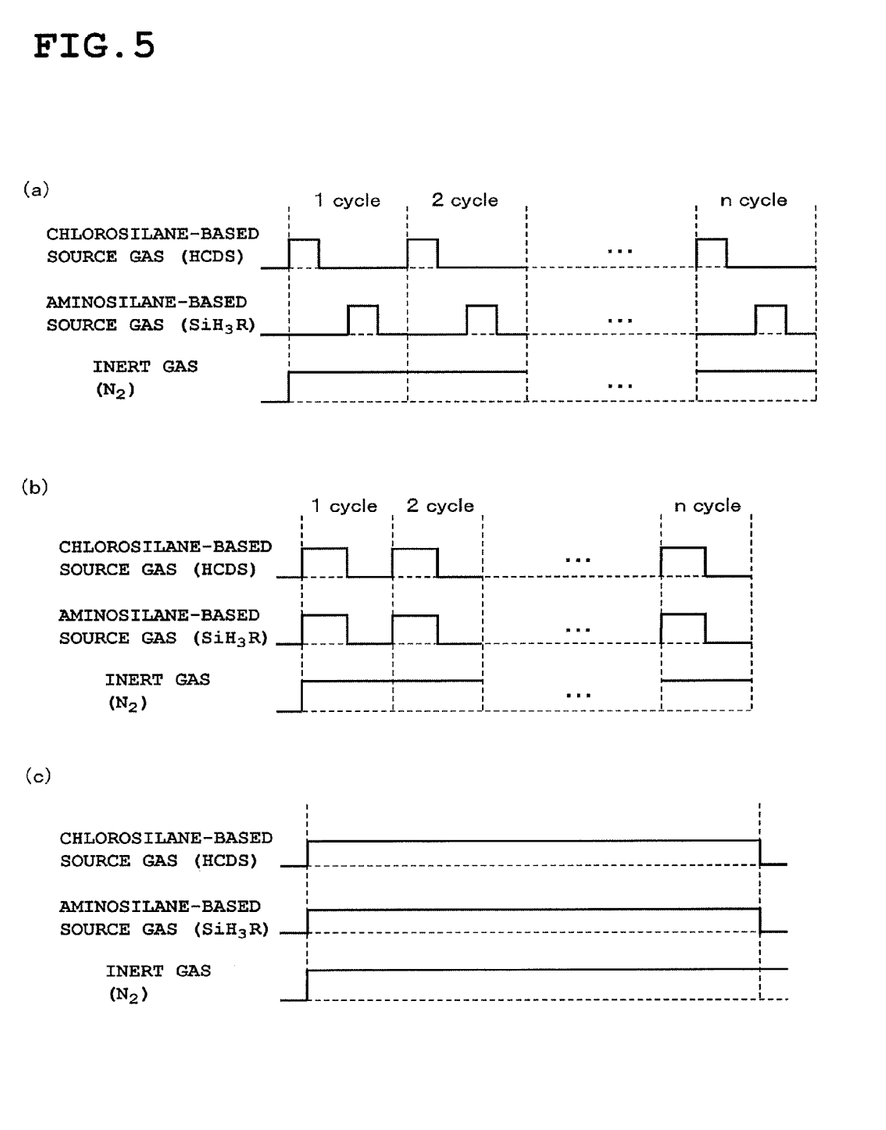
FIG. 5A is a view showing a timing of supplying gas in the film formation sequence according to this embodiment.
FIG. 5B and FIG. 5C are views showing modified examples thereof.

Next, explanation is given for an example of a sequence of forming a thin film made of the specific element alone on the substrate as one step of the manufacturing step of a semiconductor device using the processing furnace of the above-mentioned substrate processing apparatus, with reference to FIG. 4 and FIG. 5. FIG. 4 is a view showing a film formation flow in a film formation sequence of this embodiment. FIG. 5 is a view showing a timing of supplying gas in the film formation sequence of this embodiment. In the explanation given hereafter, an operation of each part constituting the substrate processing apparatus is controlled by the controller 121.

In the film formation sequence of this embodiment, the thin film made of the specific element alone, is formed on the substrate by performing a specific number of times a cycle of:

supplying the first source to the substrate, the first source containing the specific element and the halogen-group; and supplying the second source to the substrate, the second source containing the specific element and the amino-group and having amino-group-containing ligands whose number is two or less in its composition formula and not more than the number of halogen-group-containing ligands in the composition formula of the first source.

Specifically, a silicon film made of silicon alone is formed on the wafer 200 by performing the specific number of times the cycle of:

supplying the chlorosilane-based source containing silicon and the halogen-group as the first source, to the wafer 200 in the processing chamber 201;

supplying the aminosilane-based source containing silicon and the amino-group as the second source, having amino-group-containing ligands whose number is two or less in its composition formula and not more than the number of halogen-group-containing ligands in the composition formula of the chlorosilane-based source, to the wafer 200 in the processing chamber 201.

Here, "the cycle including supplying the first source and supplying the second source, is performed the specific number of times" includes the both cases of performing this cycle once and repeating this cycle multiple numbers of times, namely means a case of performing this cycle once or more (specific number of times).

The film formation sequence of this embodiment will be specifically described hereafter. Here, explanation is given for an example of forming the silicon film (Si film) made of silicon alone on the wafer 200 by the film formation flow of FIG. 4 and the film formation sequence of FIG. 5, using the HCDS gas having halogen-group-containing ligands (Cl) whose number is six in its composition formula as the chlorosilane-based source gas, and using the $SiH_3R$ gas having amino-group-containing ligands whose number is one in its composition formula as the aminosilane-based source gas.

In this specification, when using the term of a "wafer", there is a case that the wafer means the "wafer itself", or a case that the wafer means "a lamination body (assembly) of the wafer and a specific layer or film, etc., formed on the surface of the wafer" (namely, there is a case that the specific layer or film, etc., formed on the surface is collectively generally called the wafer). Further, in this specification, when using the term of the "surface of the wafer", there is a case that the surface means "the surface (exposed surface) of the wafer itself" or a case that the surface means "the surface of the specific layer or the film, etc., formed on the wafer, namely an uppermost surface of the wafer as the lamination body".

Accordingly, the description of this specification such as "a specific gas is supplied to the wafer", means a case that "the specific gas is directly supplied to the surface (exposed surface) of the wafer itself" or a case that "the specific gas is supplied to the layer or the film, etc., formed on the wafer, namely to the uppermost surface of the wafer as the lamination body". Further, the description of this specification such as "the specific layer (or the film) is formed on the wafer" means a case that "the specific layer (or the film) is directly formed on the surface (exposed surface) of the wafer itself" or a case that "the specific layer (or the film) is formed on the layer or the film, etc., formed on the wafer, namely the specific layer (or the film) is formed on the uppermost surface of the wafer as the lamination body".

Also, when using the term of the "substrate" in this specification, similarly to the case of using the term of the "wafer", the "wafer" may be replaced in this case with the "substrate" in the above-mentioned explanation.

(Wafer Charge and Boat Load)

When a plurality of wafers 200 are charged into the boat 217 (wafer charge), as shown in FIG. 1, the boat 217 supporting the plurality of wafers 200, are lifted by the boat elevator 115 and are loaded into the processing chamber 201 (boat load). In this state, the seal cap 219 is set in a state of sealing the lower end of the reaction tube 203 interposing the O-ring 220.

(Pressure Adjustment and Temperature Adjustment)

The inside of the processing chamber 201 is vacuum-exhausted by the vacuum pump 246 so as to be set in a desired pressure (vacuum degree). At this time, the pressure in the processing chamber 201 is measured by the pressure sensor 245, and based on the measured pressure information, the APC valve 244 is feedback-controlled (pressure adjustment). The state of the vacuum pump 246 is always set in an operation state, at least until the processing to the wafer 200 is completed. Further, the inside of the processing chamber 201 is heated by the heater 207 so as to be set at a desired temperature. At this time, the power supply state to the heater 207 is feedback-controlled based on the temperature information detected by the temperature sensor 263 so as to have a desired temperature distribution (temperature adjustment). Heating the inside of the processing chamber 201 by the heater 207, is continuously performed, at least until the processing to the wafer 200 is completed. Subsequently, rotations of the boat 217 and the wafers 200 are started by the rotation mechanism 267. The rotations of the boat 217 and the wafers 200 by the rotation mechanism 267 are continuously performed, at least until the processing to the wafer 200 is completed.

[Silicon Film Forming Step]

Thereafter, following two steps, namely, steps 1 and 2 are sequentially executed.

[Step 1]

(Supply of the HCDS Gas)

The valve 243a of the first gas supply tube 232a is opened, to thereby flow the HCDS gas to the first gas supply tube 232a. The HCDS gas flows in the first gas supply tube 232a, with the flow rate adjusted by the mass flow controller 241a. The HCDS gas with the flow rate adjusted, is supplied into the processing chamber 201 from the gas supply holes 250a of the first nozzle 249a, and is exhausted from the exhaust tube 231. At this time, the HCDS gas is supplied to the wafer 200. Simultaneously at this time, the valve 243c is opened, to thereby flow the inert gas such as the $N_2$ gas, etc., into the first inert gas supply tube 232c. The $N_2$ gas flows into the first inert gas supply tube 232c, with the flow rate adjusted by the mass flow controller 241c. The N₂ gas with the flow rate adjusted, is supplied into the processing chamber 201 together with the HCDS gas, and is exhausted from the exhaust tube 231. At this time, in order to prevent the invasion of the HCDS gas into the second nozzle 249b, the valve 243d is opened, to thereby flow the N₂ gas into the second inert gas supply tube 232d. The N₂ gas is supplied into the processing chamber 201 through the second gas supply tube 232b and the second nozzle 249b, and is exhausted from the exhaust tube 231.

At this time, the APC valve 244 is properly adjusted, to thereby set the pressure in the processing chamber 201 to the pressure in the range of 1 to 13300 Pa and preferably 20 to 1330 Pa for example. The supply flow rate of the HCDS gas controlled by the mass flow controller 241a is set to the flow rate in the range of 1 to 1000 sccm for example. The supply flow rate of the N₂ gas controlled by the mass flow controllers 241c, 241d is set to the flow rate in the range of 100 to 10000 sccm respectively for example. The time for supplying the HCDS gas to the wafer 200, namely a gas supply time (irradiation time) is set to the time in the range of 1 to 120 seconds, and preferably 1 to 60 seconds.

At this time, when the temperature of the wafer 200 is less than 250° C., the HCDS is hardly chemically adsorbed on the wafer 200, and a practical film formation rate cannot be obtained in some cases. This can be solved by setting the temperature of the wafer 200 to 250° C. or more. Also, by setting the temperature of the wafer 200 to 300° C. or more and further 350° C. or more, the HCDS can be more sufficiently adsorbed on the wafer 200, and a more sufficient film formation rate can be obtained. Further, when the temperature of the wafer 200 exceeds 700° C., the CVD reaction occurs strongly (a vapor phase reaction is dominant), to thereby easily deteriorate the uniformity of the film thickness, and its control becomes difficult. By setting the temperature of the wafer 200 to 700° C. or less, the deterioration of the uniformity of the film thickness can be suppressed, and its control can be achieved. Particularly, by setting the temperature of the wafer 200 to 650° C. or less, and further 600° C. or less, a surface reaction becomes dominant, thus easily securing the uniformity of the film thickness and easily facilitating its control. Thus, when the temperature of the wafer 200 is the temperature in the range of 250 to 700° C., preferably 300 to 650° C., and further preferably 350 to 600° C., the processing of step 1 (formation of the first layer described later) can be progressed.

Although details are described later, when the temperature of the wafer 200 is less than 300° C., a modifying reaction in step 2 (modifying reaction of the first layer) described later, is hardly progressed. By setting the temperature of the wafer 200 to 300° C. or more, the modifying reaction in step 2 can be easily progressed. Further, by setting the temperature of the wafer 200 to 350° C. or more, the modifying reaction in step 2 occurs more actively. Accordingly, in order to efficiently perform the processing of step 2, the temperature of the wafer 200 is preferably set to 300° C. or more, and preferably set to 350° C. or more.

Thus, a suitable temperature condition is different between step 1 and step 2, and a lower limit of a suitable temperature range for performing step 2 is higher than the lower limit of the suitable temperature range for performing step 1. Here, in order to improve the throughput of a silicon film formation step of performing the cycle of steps 1, 2, the specific number of times, the same temperature condition is preferably set in step 1 and step 2, for the temperature of the wafer 200. Namely, the lower limit of the temperature condition of the wafer 200 in step 1, is preferably set to the same lower limit of the temperature condition of the wafer 200 in step 2. Accordingly, in step 1, the temperature of the wafer 200 is set to the temperature in the range of 300 to 700° C., preferably 300 to 650° C., and more preferably 350 to 600° C. for example. If the temperature is set in this temperature zone, the processing of step 1 (formation of the first layer) and modification processing of step 2 (modification of the first layer) can be efficiently progressed respectively.

By supplying the HCDS gas to the wafer 200 under the above-mentioned condition, a silicon-containing layer containing chlorine (Cl) having a thickness of less than one atomic layer to about several atomic layers for example, is formed on the wafer 200 (underlayer on the surface) as the first layer. The silicon-containing layer containing Cl may be an adsorption layer of the HCDS gas, or may be a silicon layer (Si layer) containing Cl, or may include both layers.

Here, the silicon layer is a general name including a continuous or a discontinuous layer made of silicon (Si) and containing Cl, and a silicon thin film containing Cl formed by overlap of these layers. The continuous layer made of Si and containing Cl is also called a silicon thin film in some cases. Si constituting the silicon layer also includes a case that a bond between Si and Cl is not completely cut, and a case that the bond between Si and Cl is completely cut.

Further, the adsorption layer of the HCDS gas also includes a continuous chemical adsorption layer, and a discontinuous chemical adsorption layer, of gas molecules of the HCDS gas. Namely, the adsorption layer of the HCDS gas includes a chemical adsorption layer of one molecular layer or less than one molecular layer composed of HCDS molecules. The HCDS ($Si_2Cl_6$) molecules constituting the adsorption layer of the HCDS gas include a case that the bond between Si and Cl is partially cut ($Si_xCl_y$ molecule). Namely, the adsorption layer of the HCDS gas includes a continuous chemical adsorption layer and a discontinuous chemical adsorption layer, of $Si_2Cl_6$ molecules and/or $Si_xCl_y$ molecules.

The layer having the thickness of less than one atomic layer means an atomic layer formed discontinuously, and the layer having the thickness of one atomic layer means an atomic layer formed continuously. Further, the layer having the thickness of less than one molecular layer means a molecular layer formed discontinuously, and the layer having the thickness of one molecular layer means a molecular layer formed continuously.

The silicon layer containing Cl is formed by deposition of Si on the wafer 200 under a condition that the HCDS gas is self-decomposed (thermally decomposed), namely under a condition that a thermal decomposition reaction of HCDS is generated. The adsorption layer of the HCDS gas is formed by adsorption of the HCDS gas on the wafer 200 under a condition that the HCDS gas is not self-decomposed (thermally decomposed), namely under a condition that the thermal decomposition reaction of HCDS is not generated. Preferably, the film formation rate can be higher in a case of forming the silicon layer containing Cl on the wafer 200, than a case of forming the adsorption layer of the HCDS gas on the wafer 200.

When the thickness of the silicon-containing layer containing Cl formed on the wafer 200 exceeds several atomic layers, a modifying action in step 2 described later, does not reach the whole body of the silicon-containing layer containing Cl. Further, a minimum value of the silicon-containing layer containing Cl that can be formed on the wafer 200, is less than one atomic layer. Therefore, the thickness of the silicon-containing layer containing Cl is preferably set in the range of about less than one atomic layer to several atomic layers. By setting the thickness of the silicon-containing layer containing Cl to one atomic layer or less, namely, to one atomic layer or less than one atomic layer, an action of the modifying reaction in step 2 described later can be relatively increased, and the time required for the modifying reaction in step 2, can be shortened. Also, the time required for forming the silicon-containing layer containing Cl in step 1, can also be shortened. As a result, a processing time per one cycle can be shortened, and the processing time in total can be shortened. Namely, the film formation rate can also be increased. Further, by setting the thickness of the silicon-containing layer containing Cl to one atomic layer or less, controllability of the uniformity of the film thickness can also be improved.

(Removal of the Remained Gas)

After the silicon-containing layer containing Cl is formed as the first layer, the valve 243a of the first gas supply tube 232a is closed, to thereby stop the supply of the HCDS gas. At this time, the APC valve 244 of the exhaust tube 231 is left opened, to thereby vacuum-exhaust the inside of the processing chamber 201 by the vacuum pump 246, and remove the unreacted HCDS gas or the HCDS gas after contributing to the formation of the first layer remained in the processing chamber 201, from the processing chamber 201. At this time, the valves 243c, 243d are left opened, to thereby keep the supply of the $N_2$ gas into the processing chamber 201 as the inert gas. The $N_2$ gas functions as a purge gas, thus making it possible to increase the effect of removing the unreacted HCDS gas or the HCDS gas after contributing to the formation of the first layer remained in the processing chamber 201, from the processing chamber 201.

At this time, the gas remained in the processing chamber 201 is not required to be completely removed, and the inside of the processing chamber 201 is not required to be completely purged. If the gas remained in the processing chamber 201 is a small amount, there is no adverse influence generated in step 2 performed thereafter. At this time, the flow rate of the $N_2$ gas supplied into the processing chamber 201 is not required to be a large flow rate, and for example, by supplying about the same amount of the $N_2$ gas as the volume of the reaction tube 203 (processing chamber 201), purge of not generating the adverse influence in step 2 can be performed. Thus, by not completely purging the inside of the processing chamber 201, a purging time can be shortened, and the throughput can be improved. Further, consumption of the $N_2$ gas can be suppressed to a necessary minimum.

As the chlorosilane-based source gas, not only a hexachlorodisilane ($Si_2Cl_6$, abbreviated as HCDS) gas, but also inorganic sources such as a tetrachlorosilane namely silicon tetrachloride ($SiCl_4$, abbreviated as STC) gas having halogen-group-containing ligands (Cl) whose number is four in its composition formula, a trichlorosilane ($SiHCl_3$, abbreviated as TCS) gas having halogen-group-containing ligands (Cl) whose number is three in its composition formula, and a dichlorosilane ($SiH_2Cl_2$, abbreviated as DCS) gas having halogen-group-containing ligands (Cl) whose number is two in its composition formula, and a monochlorosilane ($SiH_3Cl$, abbreviated as MCS) gas having halogen-group-containing ligands (Cl) whose number is one in its composition formula, etc., may be used. As the inert gas, rare gases such as Ar gas, He gas, Ne gas, and Xe gas, etc., may be used other than the $N_2$ gas.

[Step 2]

(Supply of the $SiH_3R$ Gas)

After the remained gas in the processing chamber 201 is removed after end of step 1, the valve 243b of the second gas supply tube 232b is opened, to thereby flow the $SiH_3R$ gas into the second gas supply tube 232b. The flow rate of the $SiH_3R$ gas flowing into the second gas supply tube 232b is adjusted by the mass flow controller 241b. The $SiH_3R$ gas with the flow rate adjusted, is supplied into the processing chamber 201 from the gas supply holes 250b of the second nozzle 249b, and is exhausted from the exhaust tube 231. At this time, the $SiH_3R$ gas is supplied to the wafers 200. Simultaneously at this time, the valve 243d is opened, to thereby flow the $N_2$ gas into the second inert gas supply tube 232d as the inert gas. The flow rate of the $N_2$ gas flowing into the second inert gas supply tube 232d is adjusted by the mass flow controller 241d. The $N_2$ gas with the flow rate adjusted, is supplied into the processing chamber 201 together with the $SiH_3R$ gas, and is exhausted from the exhaust tube 231. At this time, in order to prevent the invasion of the $SiH_3R$ gas into the first nozzle 249a, the valve 243c is opened, to thereby flow the $N_2$ gas into the first inert gas supply tube 232c. The $N_2$ gas is supplied into the processing chamber 201 through the first gas supply tube 232a and the first nozzle 249a, and is exhausted from the exhaust tube 231.

At this time, the APC valve 244 is properly adjusted, to thereby set the pressure in the processing chamber 201 to the pressure in the range of 1 to 13300 Pa, and preferably 20 to 1330 Pa for example. The supply flow rate of the $SiH_3R$ gas controlled by the mass flow controller 241b is set to the flow rate in the range of 1 to 1000 sccm for example. The supply flow rate of the $N_2$ gas controlled by the mass flow controllers 241d, 241c is set to the flow rate in the range of 100 to 10000 sccm respectively, for example. The time for supplying the $SiH_3R$ gas to the wafers 200, namely the gas supply time (irradiation time) is set to the time in the range of 1 to 120 seconds, and preferably 1 to 60 seconds for example.

Similarly to step 1, the temperature of the heater 207 at this time, is set so that the temperature of the wafer 200 is set to the temperature in the range of 300 to 700° C., preferably 300 to 650° C., and more preferably 350 to 600° C. for example.

When the temperature of the wafer 200 is less than 300° C., the $SiH_3R$ gas supplied to the wafer 200 is hardly self-decomposed (thermally decomposed), and the amino-group-containing ligands (R) are hardly separated from the silicon in the $SiH_3R$ gas. Namely, the number of the ligands (R) that cause reaction with the first layer (silicon-containing layer containing Cl) formed in step 1, becomes easily insufficient. As a result, an extracting reaction of Cl from the first layer is hardly generated. By setting the temperature of the wafer 200 to 300° C. or more, the $SiH_3R$ gas supplied to the wafer 200 is easily thermally decomposed, and the amino-group-containing ligands (R) are easily separated from the silicon in the $SiH_3R$ gas. Then, by the reaction between the separated ligands (R) and the halogen-group (Cl) in the first layer, the extracting reaction of Cl from the first layer is easily generated. Further, by setting the temperature of the wafer 200 to 350° C. or more, the thermal decomposition of the $SiH_3R$ gas supplied to the wafer 200 becomes active, and the number of the ligands (R) separated from silicon in the $SiH_3R$ gas is easily increased. Then, due to the increase of the number of ligands (R) that cause the reaction with Cl in the first layer, a more active extracting reaction of Cl from the first layer occurs.

As described above, an upper limit of a suitable temperature range is 700° C. or less, preferably 650° C. or less, and more preferably 600° C. or less for performing the processing of step 1. In order to improve the throughput of the silicon film formation step of performing the cycle of steps 1 and 2 the specific number of times, the temperature condition is set to be the same in step 1 and step 2. Accordingly, in step 2 as well, the temperature of the wafer 200 is preferably set to the temperature in the range of 300 to 700° C., preferably 300 to 650° C., and more preferably 350 to 600° C. If the temperature is set in this temperature zone, the modifying processing in step 2 (modification of the first layer), and the processing in step 1 (formation of the first layer) can be efficiently progressed respectively.

By supplying the $SiH_3R$ gas to the wafer 200 under the above-mentioned condition, the first layer (silicon-containing layer containing Cl) formed on the wafer 200 in step 1, and the $SiH_3R$ gas are reacted with each other. Namely, by supplying the $SiH_3R$ gas to the wafer 200 heated to the above-mentioned temperature, the amino-group-containing ligands (R) are separated from silicon in the $SiH_3R$ gas, and the separated ligands (R) are reacted with Cl in the first layer to thereby extract Cl from the first layer. Further, silicon having a dangling bond (unpaired silicon) after separation of the ligands (R) in the $SiH_3R$ gas, is bonded to the silicon having the dangling bond (unpaired silicon) contained in the first layer (silicon-containing layer from which Cl is extracted), or the silicon already having the dangling bond (already unpaired silicon), to thereby form Si—Si bond. Thus, the first layer (silicon-containing layer containing Cl) formed on the wafer 200 in step 1, is changed (modified) to the second layer containing silicon and having extremely low content of the impurities such as chlorine (Cl), carbon (C), nitrogen (N), etc. The second layer is the layer having the thickness of less than one atomic layer to about several atomic layers, and is changed to the silicon layer (Si layer) made of silicon alone with extremely low content of the impurities such as chlorine (Cl), carbon (C), nitrogen (N), etc. A crystal structure of the Si layer is in an amorphous state or a polycrystalline state, and such a Si layer can be called an amorphous silicon layer (a-Si layer) or a polysilicon layer (Poly-Si layer).

When the silicon layer is formed as the second layer, Cl contained in the first layer before modification, and the amino-group-containing ligands (R) in the $SiH_3R$ gas, are reacted with each other in a process of the modifying reaction of the first layer by the $SiH_3R$ gas, thus producing a gaseous reaction product such as amino salt, and is discharged from the processing chamber 201 through the exhaust tube 231. Thus, the content of the impurities such as Cl, C, N, etc., contained in the second layer can be reduced.

Then at this time, by using the HCDS gas having halogen-group-containing ligands (Cl) whose number is six in its composition formula as the chlorosilane-based source gas, and using the $SiH_3R$ gas having amino-group-containing ligands (R) whose number is one in its composition formula as the aminosilane-based source gas, namely by using the source having amino-group-containing ligands whose number is two or less in its composition formula and not more than the number of the halogen-group-containing ligands in the composition formula of the chlorosilane-based source, the content of the impurities such as C, N contained in the first layer after modification, namely in the second layer, can be further reduced.

This is because there is more content of Cl in the first layer (silicon-containing layer containing Cl) before modification, compared with the amino-group-containing ligands (R) in the $SiH_3R$ gas supplied to the first layer (silicon-containing layer containing Cl) in step 2, by using the above-mentioned source as the aminosilane-based source and the chlorosilane-based source. In this case, a major amount of the amino-group-containing ligands (R) in the $SiH_3R$ gas is reacted with Cl contained in the first layer before modification, namely Cl which exists more than the amino-group-containing ligands (R) in a process of the modifying reaction of the first layer, to thereby produce the gaseous reaction product such as the amino salt, etc., and is discharged from the processing chamber 201 through the exhaust tube 231. Namely, the major amount of the amino-group-containing ligands (R) in the $SiH_3R$ gas is discharged and disappears from the processing chamber 201, without being taken into the first layer after modification, namely into the second layer. As a result, the first layer after modification, namely the second layer is changed (modified) to the silicon layer having extremely low content of the impurities such as C, N. In order to properly generate the reaction, the following state is required to be properly maintained. Namely, the number of the amino-group-containing ligands (R) in the $SiH_3R$ gas, needs to be smaller than the number of Cl contained in the first layer before modification. To be realized this state, the supply amount of the $SiH_3R$ gas in step 2 is preferably set to be equivalent to the supply amount of the HCDS gas in step 1 or set to be smaller than the supply amount of the HCDS gas in step 1. Namely, the number of $SiH_3R$ molecules supplied in step 2 is preferably set to be equivalent to the number of HCDS molecules or smaller than the number of HCDS molecules supplied in step 1.

(Removal of the Remained Gas)

After formation of the silicon layer as the second layer, the valve 243b of the second gas supply tube 232b is closed, to thereby stop the supply of the $SiH_3R$ gas. At this time, the APC valve 244 of the exhaust tube 231 is left opened, to thereby vacuum-exhaust the inside of the processing chamber 201 by the vacuum pump 246, and remove the unreacted $SiH_3R$ gas or the $SiH_3R$ gas after contributing to the formation of the second layer, or the reaction byproduct remained in the processing chamber 201, from the processing chamber 201. At this time, the valves 243d, 243c are left opened, to thereby keep the supply of the $N_2$ gas into the processing chamber 201 as the inert gas. The $N_2$ gas functions as the purge gas, thus improving the effect of removing the unreacted $SiH_3R$ gas or the $SiH_3R$ gas after contributing to the formation of the second layer or the reaction byproduct remained in the processing chamber 201, from the processing chamber 201.

At this time, the gas remained in the processing chamber 201 is not required to be completely removed, and the inside of the processing chamber 201 is not required to be completely purged. If the gas remained in the processing chamber 201 is a small amount, there is no adverse influence generated in step 1 performed thereafter. At this time, the flow rate of the $N_2$ gas supplied into the processing chamber 201 is not required to be a large flow rate, and for example, by supplying about the same amount of the $N_2$ gas as the volume of the reaction tube 203 (processing chamber 201), purge of not generating the adverse influence in step 1 can be performed. Thus, by not completely purging the inside of the processing chamber 201, a purging time can be shortened, and the throughput can be improved. Further, consumption of the $N_2$ gas can be suppressed to a necessary minimum.

As described above, as the aminosilane-based source, the organic source having amino-group-containing ligands whose number is two or less in its composition formula and not more than the number of the halogen-group-containing ligands in the composition formula of the chlorosilane-based source, can be used.

For example, when using HCDS ($Si_2Cl_6$), STC ($SiCl_4$), TCS ($SiHCl_3$), and DCS ($SiH_2Cl_2$), having halogen-group-containing ligands (Cl) whose number is two or more in its composition formula as the chlorosilane-based source, diaminosilane ($SiH_2RR'$) having amino-group-containing ligands (R) whose number is two in its composition formula, can be suitably used as the aminosilane-based source, other than monoaminosilane ($SiH_2R$) having amino-group-containing ligands (R) whose number is one in its composition formula. Further, when using MCS ($SiH_3Cl$) having halogengroup-containing ligands (Cl) whose number is one in its composition formula, monoaminosilane ($SiH_3R$) having amino-group-containing ligands (R) whose number is one in its composition formula, can be suitably used as the aminosilane-based source.

Here, R, R' indicate ligands respectively, and indicate the amino-group (one or both of H of the amino-group expressed by $NH_2$ are replaced with the hydrocarbon group containing one or more carbon atoms (C)) in which one or two hydrocarbon-groups containing one or more carbon atoms (C) are coordinated in one nitrogen atom (N). When two hydrocarbon-groups constituting a part of the amino-group, are coordinated in one N, the two hydrocarbon groups may be the same hydrocarbon groups, or may be different hydrocarbon groups. Further, the hydrocarbon group may include the unsaturated bond such as the double bond or the triple bond. Moreover, the amino-groups of R, R' may be the same amino-groups or may be different amino-groups respectively. Further, the amino-group may have the ring-structure. For example, as $SiH_2RR'$, bis(diethylamino)silane ($SiH_2[N(C_2H_5)_2]_2$, abbreviated as BDEAS), bis(tertiarybutylamino)silane ($SiH_2[NH(C_4H_9)]_2$, abbreviated as BTBAS), bis(diethylpyperidino)silane ($SiH_2[NC_5H_8(C_2H_5)_2]_2$, abbreviated as BDEPS), etc., can be used.

The number of the amino-group-containing ligands (R) in the composition formula of the aminosilane-based source, is preferably smaller than the number of the halogen-group-containing ligands (Cl) in the composition formula of the chlorosilane-based source. Accordingly, when using the DCS having halogen-group-containing ligands (Cl) whose number is two in its composition formula, monoaminosilane having amino-group-containing ligands (R) whose number is one in its composition formula, is more preferably used than using the diaminosilane having amino-group-containing ligands (R) whose number is two in its composition formula.

Further, the number of the amino-group-containing ligands (R) in the composition formula of the aminosilane-based source is more preferably one. Accordingly, as the aminosilane-based source, monoaminosilane is more preferably used than using the diaminosilane. In this case, in order to set the number of the amino-group-containing ligands (R) in the composition formula of the aminosilane-based source, to be smaller than the number of the halogen-group-containing ligands (Cl) in the composition formula of the chlorosilane-based source, HCDS, STC, TCS, DCS are preferably used having halogen-group-containing ligands (Cl) whose number is two or more in its composition formula.

Thus, there are more content of Cl in the first layer (silicon-containing layer containing Cl) before modification, than the content of the amino-group-containing ligands (R) in the $SiH_3R$ gas supplied to the first layer (silicon-containing layer containing Cl) in step 2. Then, the amino-group-containing ligands (R) can be surely prevented from being taken into the first layer after modification, namely into the second layer. As a result, the content of the impurities such as C, N contained in the second layer can be more efficiently reduced.

As the inert gas, rare gases such as Ar gas, He gas, Ne gas, and Xe gas, etc., may be used other than the $N_2$ gas.

(Cycle Performed Specific Number of Times)

The silicon film (Si film) made of silicon alone having a specific film thickness with extremely less content of the impurities such as chlorine (Cl), carbon (C), and nitrogen (N), etc., can be formed on the wafer 200, by performing the cycle of the steps 1, 2 once or more (specific number of times), with steps 1, 2 as one cycle. The crystal structure of the Si film is set in the amorphous state or in the polycrystalline state, and the Si film can also be called an amorphous silicon (a-Si film) or a polysilicon film (Poly-Si film). The above-mentioned cycle is preferably repeated multiple numbers of times. Namely, the thickness of the Si layer formed per one cycle is set to be smaller than a desired film thickness, and the above-mentioned cycle is preferably repeated multiple numbers of times until the desired film thickness is obtained.

When the cycle is performed multiple numbers of times, the description "the specific gas is supplied to the wafer 200" means "the specific gas is supplied to the layer formed on the wafer 200, namely to the uppermost surface of the wafer 200 as the lamination body", and the description "the specific layer is formed on the wafer 200" means "the specific layer is formed on the layer formed on the wafer 200, namely on the uppermost surface of the wafer 200 as the lamination body", in each step of at least a second cycle and thereafter. This point is described above. The same thing can be said for a modified example and other embodiment described later in this point.

(Purge and Return to Atmospheric Pressure)

When the processing of forming the Si film having the specific thickness is performed, the valves 243c, 243d are opened, and the $N_2$ gas as the inert gas is supplied from each of the first inert gas supply tube 232c and the second inert gas supply tube 232d, and is exhausted from the exhaust tube 231. The $N_2$ gas functions as the purge gas, thus purging the inside of the processing chamber 201 with the inert gas, and removing the gas or the reaction byproduct remained in the processing chamber 201 from the processing chamber 201 (purge). Thereafter, the atmosphere in the processing chamber 201 is replaced with the inert gas (replacement with the inert gas), and the pressure in the processing chamber 201 is returned to a normal pressure (return to atmospheric pressure).

(Boat Unload and Wafer Discharge)

Thereafter, the seal cap 219 is descended by the boat elevator 115, and the lower end of the reaction tube 203 is opened, so that the processed wafers 200 are unloaded to outside of the reaction tube 203 from the lower end of the reaction tube 203 in a state of being supported by the boat 217 (boat unload). Thereafter, the processed wafers 200 are discharged from the boat 217 (wafer discharge).

(3) Effect of the this Embodiment

According to this embodiment, one or a plurality of effects shown below are exhibited.

According to the film formation sequence of this embodiment, in step 2, by causing a reaction between the first layer (silicon-containing layer containing Cl) and the $SiH_3R$ gas, the first layer can be modified to the second layer (silicon layer) with less content of the impurities such as Cl, C, N, etc. As a result, by performing the cycle of the steps 1, 2 the specific number of times, an excellent silicon film with less content of the impurities such as Cl, C, N, etc., can be formed in a low temperature zone. This is because when the silicon layer as the second layer is formed in step 2, the reaction is caused between Cl contained in the first layer before modification, and the amino-group-containing ligands (R) in the $SiH_3R$ gas, in the process of the modifying reaction of the first layer by the $SiH_3R$ gas, and a reaction product is discharged from the processing chamber 201 through the exhaust tube 231.

Further, according to this embodiment, the source having amino-group-containing ligands whose number is two or less in its composition formula and not more than the number of the halogen-group-containing ligands in the composition formula of the chlorosilane-based source, is used as the aminosilane-based source. Specifically, the HCDS gas having halogen-group-containing ligands (Cl) whose number is six in its composition formula, is used as the chlorosilane-based source, and the SiH$_3$R gas having amino-group-containing ligands (R) whose number is one in its composition formula, is used as the aminosilane-based source. Thus, the first layer after modification, namely the second layer can be changed to the silicon layer with extremely less content of the impurities such as C, N, etc. As a result, the excellent silicon film with extremely less content of the impurities such as C, N, etc., can be formed in the low temperature zone.

This is because by using the above-mentioned sources as the aminosilane-based source and the chlorosilane-based source, there is much more content of Cl in the first layer before modification (silicon-containing layer containing Cl) than the content of amino-group-containing ligands (R) in the SiH$_3$R gas supplied to the first layer (silicon-containing layer containing Cl) in step 2. In this case, the major amount of the amino-group-containing ligands (R) in the SiH$_3$R gas, is reacted with Cl contained in the first layer before modification, in the process of the modifying reaction of the first layer in step 2, and the reaction product is discharged from the processing chamber 201 without being taken into the first layer after modification, namely into the second layer. As a result, the first layer after modification, namely the second layer is changed (modified) to the silicon layer with extremely less content of the impurities such as C, N. Also, it is confirmed by inventors of the present invention, that the content of the impurities such as C, N, etc., contained in the silicon film is easily increased, when using the source having amino-group-containing ligands whose number is exceeding two in its composition formula, such as tris(dimethylamino)silane (Si[N(CH$_3$)$_2$]$_3$H, abbreviated as 3DMAS), and tetrakis(dimethylamino) silane (Si[N (CH$_3$)$_2$]$_4$, abbreviated as 4DMAS), etc.

The silicon film formed by such a film formation technique is a dense film with high wet etching durability against HF, etc., for example, and can be suitably used as the film, etc., for an etching mask at the time of etching performed to the SiO film, etc., of the underlayer using HF for example. In this case, the silicon film is not the insulating film such as the SiO film and the SiN film, and therefore needs to be removed after being used as the film for the etching mask for example.

Further, according to the film formation sequence of this embodiment, in step 2, the SiH$_3$R gas with less content of the amino-group in its composition formula (In one molecule), is used as the aminosilane-based source. Specifically, the source gas containing the amino-group alone in its composition formula (In one molecule), is used. Thus, by using the source gas with less content of C, N in its composition formula as the aminosilane-based source gas, the content of the impurities such as C, N contained in the second layer formed in step 2 can be easily reduced, and particularly the content of N can be considerably reduced. Then, the content of the impurities such as C, N, etc., contained in the formed silicon film can be easily reduced, and particularly the content of N can be considerably reduced.

Further, according to the film formation sequence of this embodiment, by using two sources (silane sources) of the chlorosilane-based source and the aminosilane-based source, the silicon film can be formed even in the low temperature zone. According to an experiment by the inventors of the present invention, when the chlorosilane-based source alone is used, it is difficult to deposit silicon on the wafer with the film formation rate of satisfying a production efficiency in the temperature zone of 500° C. or less. Also, when the aminosilane-based source alone is used, even the deposition of silicon on the wafer is not confirmed in the temperature zone of 500° C. or less. However, according to the technique of this embodiment, the excellent silicon film can be formed with the film formation rate of satisfying the production efficiency even in the temperature zone of 500° C. or less, for example, in the temperature zone of 300 to 450° C.

When the film formation temperature is lowered, usually a kinetic energy of the molecule is also lowered, and a reaction or a desorption of the chlorine contained in the chlorosilane-based source or the amine contained in the aminosilane-based source, hardly occurs, and the ligands thereof are remained on the surface of the wafer. Then, these remained ligands sterically hinder the adsorption of silicon on the surface of the wafer, thus reducing density of the silicon and causing deterioration of the film. However, even in a condition that such reaction and desorption are hardly generated, these remained ligands can be desorbed by properly causing a reaction between two silane sources, namely the chlorosilane-based source and the aminosilane-based source. Then such sterical hindering is solved by the desorption of the remained ligands, thus allowing the silicon to be adsorbed on an open site, and increasing the density of the silicon. Thus, it seems that the film with high silicon density can be formed even in the temperature zone of 500° C. or less, for example, in the temperature zone of 300 to 450° C. It is confirmed that the content of the impurities such as Cl, C, N, etc., in the formed silicon film can be reduced by setting the film formation temperature to 450° C. or less, and for example in the temperature zone of 300 to 450° C.

According to this embodiment, the excellent silicon film can be formed by the thermal reaction (by the thermal chemical reaction) under the atmosphere of non-plasma (without using plasma). Therefore, the present invention can also be applied to a process involving a concern of plasma damage.

Further according to this embodiment, the reaction can be properly progressed under the condition that the surface reaction is dominant by using an alternate supplying method of alternately supplying the chlorosilane-based source and the aminosilane-based source to the wafer 200, and a step coverage characteristic of the silicon film can be improved. Further, controllability for controlling the film thickness of the silicon film can also be improved.

(4) Modified Example

In the above-mentioned film formation sequence shown in FIG. 4 and FIG. 5A, explanation is given for an example of forming the silicon film on the wafer 200 by alternately performing the cycle of steps 1, 2 once or more (specific number of times), namely by alternately supplying the chlorosilane-based source gas and the aminosilane-based source gas. However, this embodiment is not limited thereto.

For example, it is also acceptable that the silicon film is formed on the wafer 200 by simultaneously performing the cycle of the steps 1, 2 once or more (specific number of times), namely by simultaneously supplying the chlorosilane-based source gas and the aminosilane-based source gas. FIG. 5B shows an example of simultaneously performing the steps 1, 2 multiple numbers of times (n-times), and FIG. 5C shows an example of simultaneously performing the steps 1, 2 once. In the film formation sequence shown in FIG. 5B, the film thickness of the silicon film formed on the wafer 200 can be controlled by adjusting mainly the number of times of performing the cycle. Also, in the film formation sequence shown in FIG. 5C, the film thickness of the silicon film formed on the wafer 200 can be controlled by adjusting mainly the time for performing the cycle (gas supply time). A similar processing condition as the processing condition of the film formation sequence shown in FIG. 4 and FIG. 5A may be used as the processing condition in the above cases.

Thus, a similar effect as the effect of the above-mentioned embodiment can be obtained, not by sequentially supplying the chrolosilane-based source gas and the aminosilane-based source gas, but by simultaneously supplying these gases, to the wafer 200 in the processing chamber 201. However, the chlorosilane-based source gas and the aminosilane-based source gas can be properly reacted with each other and controllability for controlling the film thickness of the silicon film can be improved, under the condition that the surface reaction is dominant by sequentially supplying the chlorosilane-based source gas and the aminosilane-based source gas, namely by alternately supplying the chlorosilane-based source gas and the aminosilane-based source gas, interposing the purge of the inside of the processing chamber 201 between them.

<Other Embodiment of the Present Invention>

As described above, the embodiment of the present invention is specifically described. However, the present invention is not limited to the above-mentioned embodiment, and can be variously modified in a range not departing from the gist of the invention.

For example, in the above-mentioned embodiment, explanation is given for the example of supplying the chlorosilane-based source to the wafer 200 in the processing chamber 201, and thereafter supplying the aminosilane-based source thereto. However, a flowing manner of the source may be reversed. Namely, the aminosilane-based source is supplied, and thereafter the chlorosilane-based source may be supplied. Namely, one of the chlorosilane-based source and the aminosilane-based source is supplied, and thereafter the other source may be supplied. Thus, by changing an order of flowing the source, a film quality of the formed thin film can be changed.

Further, for example, in the above-mentioned embodiment, explanation is given for the example of using the chlorosilane-based source and the aminosilane-based source. However, a silane-based source having halogen-based ligands other than the chlorosilane-based source, can also be used instead of the chlorosilane-based source. For example, a fluorosilane-based source may be used instead of the chlorosilane-based source. Here, the fluorosilane-based source means the silane-based source having a fluoro-group as the halogen-group, and means the source containing at least silicon (Si) and fluorine (F). As the fluorosilane-based source gas, for example tetrafluorosilane namely a silicon fluoride gas such as a silicon tetrafluoride ($SiF_4$) gas or a hexafluorodisilane ($Si_2F_6$) gas, etc., can be used. In this case, the fluorosilane-based source is supplied to the wafer 200 in the processing chamber 201, and thereafter the aminosilane-based source is supplied or the aminosilane-based source is supplied, and thereafter the fluorosilane-based source is supplied. However, the chlorosilane-based source is preferably used as the silane-based source having the halogen-group, in terms of a steam pressure of the source, or the steam pressure of the reaction byproduct generated in step 2.

Further, for example, in the above-mentioned embodiment, explanation is given for the example of using monoaminosilane ($SiH_3R$) as the second source (aminosilane-based source). However, the present invention is not limited thereto. Namely, as described above, for example diaminosilane ($SiH_2RR'$) may be used as the second source. Namely, the source containing two amino-groups in its composition formula (In one molecule) may be used as the second source. Thus, even if using the source containing a plurality of amino-groups in its composition formula (In one molecule) as the second source, the silicon film with less content of the impurities such as carbon (C) and nitrogen (N) can be formed in the low temperature zone.

However, as the number of amino-groups contained in the composition formula of the second source is smaller, namely when there is less content of carbon (C) and nitrogen (N) contained in its composition formula, the content of the impurities such as carbon (C) and nitrogen (N) contained in the second layer can be easily reduced, and the silicon film with extremely less content of the impurities can be easily formed. Namely as described above, the content of the impurities in the silicon film can be preferably easily reduced by using $SiH_3R$ rather than using $SiH_2RR'$ as the second source.

Further, by using the silicon film formed by the technique of this embodiment as an etching stopper, a device formation technique excellent in processability can be provided. Further, the silicon film formed by the technique of this embodiment can be suitably applied to various purposes such as a floating gate electrode or a control gate electrode of a semiconductor memory device, channel silicon, a gate electrode of a transistor, a capacitor electrode of DRAM, STI liner, and a solar cell, etc.

Further, in the above-mentioned embodiment, explanation is given for the example of forming the silicon film (Si film) containing silicon being a semiconductor element, as the thin film containing the specific element. However, the present invention can also be applied to a case of forming a metal-based thin film containing a metal element such as titanium (Ti), zirconium (Zr), hafnium (Hf), tantalum (Ta), aluminum (Al), and molybdenum (Mo), etc.

In this case, the similar film formation sequence as the above-mentioned embodiment can be performed, using the source containing the metal element and the halogen-group (first source) instead of the chlorosilane-based source in the above-mentioned embodiment, and using the source containing the metal element and the amino-group (second source) instead of the aminosilane-based source. For example, the source containing the metal element and the chloro-group, or the source containing the metal element and the fluoro-group can be used as the first source.

Namely, in this case, a metal element thin film made of the metal element alone, namely a metal film is formed on the wafer 200 as the metal-based thin film containing the metal element, by performing the specific number of times a cycle of:

supplying the first source to the wafer 200, the first source containing the metal element and the halogen-group; and supplying the second source to the wafer 200, the second source containing the metal element and the amino-group and having amino-group-containing ligands whose number is two or less in its composition formula and not more than the number of the halogen-group-containing ligands in the composition formula of the first source.

For example, when a Ti film being a Ti-based thin film made of Ti alone is formed as the metal-based thin film, the source containing Ti and the chloro-group such as titanium tetrachloride ($TiCl_4$), etc., and the source containing Ti and the fluoro-group such as titanium tetrafluoride ($TiF_4$), etc., can be used as the first source. Also, the source containing Ti and the amino-group and having amino-group-containing ligands whose number is two or less in its composition formula and not more than the number of the halogen-group-containing ligands in the composition formula of the first source, can be used as the second source. As the second source, the source containing the amino-group alone in its composition formula is preferably used. The similar processing condition as the processing condition of the above-mentioned embodiment for example, can be used as the processing condition at this time.

Further for example, when a Zr film being a Zr-based thin film made of Zr alone is formed as the metal-based thin film, the source containing Zr and the chloro-group such as zirconium tetrachloride ($ZrCl_4$), etc., and the source containing Zr and the fluoro-group such as zirconium tetrafluoride ($ZrF_4$), etc., can be used as the first source. Also, the source containing Zr and the amino-group and having amino-group-containing ligands whose number is two or less in its composition formula and not more than the number of the halogen-group-containing ligands in the composition formula in the first source, can be used as the second source. The source containing the amino-group alone in its composition formula, is preferably used as the second source. The similar processing condition as the processing condition of the above-mentioned embodiment for example, can be used as the processing condition at this time.

Further for example, when an Hf film being an Hf-based thin film made of Hf alone is formed as the metal-based thin film, the source containing Hf and the chloro-group such as hafnium tetrachloride ($HfCl_4$), etc., and the source containing Hf and the fluoro-group such as hafnium tetrafluoride ($HfF_4$), etc., can be used as the first source. Also, the source containing Hf and the amino-group and having amino-group-containing ligands whose number is two or less in its composition formula and not more than the number of the halogen-group-containing ligands in the composition formula of the first source, can be used as the second source. As the second source, the source containing the amino-group alone in it composition formula is preferably used. The similar processing condition as the processing condition of the above-mentioned embodiment for example, can be used as the processing condition at this time.

Thus, the present invention can be applied not only to the silicon-based thin film, but also to the film formation of the metal-based thin film, and even in this case, the similar effect as the effect of the above-mentioned embodiment can be obtained.

Namely, the present invention can be applied to a case of forming the thin film containing the specific element such as the semiconductor element and the metal element, etc.

Further, in the above-mentioned embodiment, explanation is given for the example of forming the thin film using the batch-type substrate processing apparatus for processing a plurality of substrates at once. However, the present invention is not limited thereto, and can be suitably applied to a case of forming the thin film using a single wafer type substrate processing apparatus for processing one or several substrates at once.

Further, each of the above-mentioned embodiment and the modified example can be suitably used in combination.

Further, the present invention can also be realized by changing the process recipe of the existing substrate processing apparatus for example. When the process recipe is changed, the process recipe of the present invention can be installed in the existing substrate processing apparatus via an electric communication line or a recording medium in which the process recipe is recorded, or the process recipe itself can be changed to the process recipe of the present invention by operating the input/output device of the existing substrate processing apparatus.

EXAMPLE

The silicon film was formed on the wafer based on the film formation sequence shown in the above-mentioned FIG. 4 and FIG. 5A, using the substrate processing apparatus of the above-mentioned embodiment. The HCDS gas was used as the chlorosilane-based source gas (first source), and the $SiH_3R$ gas was used as the aminosilane-based source gas (second source). The temperature of the wafer during film formation was set to the temperature in the range of 400 to 500° C. The other processing condition was set to a specific value in the range of the processing condition described in the above-mentioned embodiment. Then, the concentration of Cl, C, N contained in the formed silicon film was measured by HR-RBS (High Resolution Rutherford Back-scattering Spectrometry).

As a result, the concentration of Cl, C, N contained in the formed silicon film in this embodiment was confirmed to be Cl: 2.3%, C: 1.9%, and N: less than % (less than detection lower limit). Namely, according to the film formation sequence shown in FIG. 4 and FIG. 5A, it was found that the silicon film with extremely less content of the impurities such as Cl, C, N, etc., could be formed in the low temperature zone.

<Preferable Aspect of the Present Invention>

Preferable aspects of the present invention will be described hereafter.

(Supplementary Description 1)

According to an aspect of the present invention, there is provided a method of manufacturing a semiconductor device, including, forming a thin film made of a specific element alone on a substrate by performing a specific number of times a cycle of:

supplying a first source to the substrate, the first source containing the specific element and a halogen-group; and supplying a second source to the substrate, the second source containing the specific element and an amino-group, and having amino-group-containing ligands whose number is two or less in its composition formula and not more than the number of halogen-group-containing ligands in the composition formula of the first source.

(Supplementary Description 2)

There is provided the method of the supplementary description 1, wherein the number of the amino-group-containing ligands in the composition formula of the second source, is smaller than the number of the halogen-group-containing ligands in the composition formula of the first source.

(Supplementary Description 3)

There is provided the method of the supplementary description 1 or 2, wherein the number of the amino-group-containing ligands in the composition formula of the second source is one.

(Supplementary Description 4)

There is provided the method of any one of the supplementary descriptions 1 to 3, wherein in supplying the first source, a first layer containing the specific element and the halogen-group is formed;

in supplying the second source, a second layer made of the specific element alone, is formed by modifying the first layer; and in forming the thin film, a temperature of the substrate is set to the temperature for separating the amino-group-containing ligands from the specific element in the second source, the temperature for extracting the halogen-group from the first layer by causing a reaction between the separated ligands and the halogen-group in the first layer, and the temperature for making a bond between the specific element from which the ligands are separated in the second source, and the specific element in the first layer.

(Supplementary Description 5)

There is provided the method of any one of the supplementary descriptions 1 to 4, wherein in forming the thin film, a temperature of the substrate is set to the temperature of 300° C. or more and 700° C. or less.

(Supplementary Description 6)

There is provided the method of any one of the supplementary descriptions 1 to 5, wherein in forming the thin film, a temperature of the substrate is set to the temperature of 300° C. or more and 650° C. or less.

(Supplementary Description 7)

There is provided the method of any one of the supplementary descriptions 1 to 6, wherein in forming the thin film, a temperature of the substrate is set to the temperature of 350° C. or more and 600° C. or less.

(Supplementary Description 8)

There is provided the method of any one of the supplementary descriptions 1 to 7, wherein the specific element contains a semiconductor element or a metal element.

(Supplementary Description 9)

There is provided the method of any one of the supplementary descriptions 1 to 7, wherein the specific element contains a silicon element.

(Supplementary Description 10)

There is provided the method of any one of the supplementary descriptions 1 to 7, wherein the specific element contains a silicon element, and the thin film contains a silicon film.

(Supplementary Description 11)

According to other aspect of the present invention, there is provided a method of manufacturing a semiconductor device, including:

forming a silicon film on a substrate by performing a specific number of times a cycle of:

supplying a first source to the substrate, the first source containing silicon and a halogen-group;

supplying a second source to the substrate, the second source containing silicon and an amino-group, and having amino-group-containing ligands whose number is two or less in its composition formula and not more than the number of halogen-group-containing ligands in the composition formula of the first source.

(Supplementary Description 12)

There is provided the method of the supplementary description 11, wherein the number of the amino-group-containing ligands in the composition formula of the second source is smaller than the number of the halogen-group-containing ligands in the composition formula of the first source.

(Supplementary Description 13)

There is provided the method of the supplementary description 11 or 12, wherein the number of the amino-group-containing ligands in the composition formula of the second source is one.

(Supplementary Description 14)

There is provided the method of the supplementary descriptions of any one of 11 to 13, wherein the second source contains monoaminosilane.

(Supplementary Description 15)

According to further other aspect of the present invention, there is provided a substrate processing method, including:

forming a thin film made of a specific element alone on a substrate by performing a specific number of times a cycle of:

supplying a first source to the substrate, the first source containing the specific element and a halogen-group; and supplying a second source to the substrate, the second source containing the specific element and an amino-group, and having amino-group-containing ligands whose number is two or less in its composition formula and not more than the number of halogen-group-containing ligands in the composition formula of the first source.

(Supplementary Description 16)

According to further other aspect of the present invention, there is provided a substrate processing apparatus, including:

a processing chamber configured to house a substrate;

a first source supply system configured to supply a first source to the substrate in the processing chamber, the first source containing a specific element and a halogen-group;

a second source supply system configured to supply a second source to the substrate in the processing chamber, the second source containing the specific element and an amino-group, and having amino-group-containing ligands whose number is two or less in its composition formula and not more than the number of halogen-group-containing ligands in the composition formula of the first source; and a control part configured to control the first source supply system and the second source supply system, so as to perform processing of forming a thin film made of the specific element alone, on a substrate by performing a specific number of times a cycle of:

processing of supplying the first source to the substrate in the processing chamber; and processing of supplying the second source to the substrate in the processing chamber.

(Supplementary Description 17)

According to further other aspect of the present invention, there is provided a program for making a computer execute a procedure of forming a thin film made of a specific element alone on a substrate by performing a specific number of times a cycle of:

a procedure of supplying a first source to the substrate in a processing chamber, the first source containing the specific element and a halogen-group; and a procedure of supplying a second source to the substrate in the processing chamber, the second source containing the specific element and an amino-group, and having amino-group-containing ligands whose number is two or less in its composition formula and not more than the number of halogen-group-containing ligands in the composition formula of the first source.

(Supplementary Description 18)

According to further other aspect of the present invention, there is provided a non-transitory computer-readable recording medium recording a program for making a computer execute a procedure of forming a thin film made of a specific element alone on a substrate by performing a specific number of times a cycle of:

a procedure of supplying a first source to the substrate in a processing chamber, the first source containing the specific element and a halogen-group; and a procedure of supplying a second source to the substrate in the processing chamber, the second source containing the specific element and an amino-group, and having amino-group-containing ligands whose number is two or less in its composition formula and not more than the number of halogen-group-containing ligands in the composition formula of the first source.

What is claimed is:

1. A method of manufacturing a semiconductor device, comprising:

forming a thin film consisting of a specific element on a substrate by performing once or more a cycle comprising:

supplying a first source to the substrate, the first source containing the specific element and a halogen-group, and forming a first layer containing the specific element and the halogen-group; and supplying a second source to the substrate, the second source containing the same specific element as the specific element in the first source and an amino-group and having amino-group-containing ligand whose number is two or less in one molecule and not more than the number of halogen-group-containing ligand in one molecule of the first source, modifying the first layer, and forming a second layer consisting of the specific element;

wherein in forming the second layer,
the amino-group-containing ligand is separated from an atom of the specific element in the second source,
an atom constituting the halogen-group is extracted from the first layer by causing a reaction between the separated ligand and an atom constituting the halogen-group in the first layer, and further
a bond between the atom of the specific element from which the ligand is separated in the second source and the atom of the specific element in the first layer is made without making a bond between the separated ligand and the atom of the specific element in the first layer.

2. The method of claim 1, wherein the number of the amino-group-containing ligand in one molecule of the second source, is smaller than the number of the halogen-group-containing ligand in one molecule of the first source.

3. The method of claim 1, wherein the number of the amino-group-containing ligand in one molecule of the second source is one.

4. The method of claim 1, wherein
in forming the second layer, a temperature of the substrate is set to:
the temperature for separating the amino-group-containing ligand from the atom of the specific element in the second source,
the temperature for extracting the atom constituting the halogen-group from the first layer by causing a reaction between the separated ligand and the atom constituting the halogen-group in the first layer, and further
the temperature for making the bond between the atom of the specific element from which the ligand is separated in the second source and the atom of the specific element in the first layer without making the bond between the separated ligand and the atom of the specific element in the first layer.

5. The method of claim 1, wherein in forming the thin film, a temperature of the substrate is set to the temperature of 300° C. or more and 700° C. or less.

6. The method of claim 1, wherein in forming the thin film, a temperature of the substrate is set to the temperature of 300° C. or more and 650° C. or less.

7. The method of claim 1, wherein in forming the thin film, a temperature of the substrate is set to the temperature of 350° C. or more and 600° C. or less.

8. The method of claim 1, wherein the specific element includes a semiconductor element or a metal element.

9. The method of claim 1, wherein the specific element includes silicon.

10. The method of claim 9, wherein the second source includes monoaminosilane.

11. The method of claim 1, wherein forming the thin film is performed under an atmosphere of non-plasma.

12. The method of claim 1, in forming the thin film, supplying the first source and supplying the second source are performed alternately.

13. The method of claim 1, in forming the thin film, supplying the first source and supplying the second source are performed simultaneously.

14. A method of manufacturing a semiconductor device, comprising:
forming a thin film consisting of silicon on a substrate by performing once or more a cycle comprising:
supplying a first source to the substrate, the first source containing silicon and a halogen-group, and forming a first layer containing the silicon and the halogen-group, and
supplying a second source to the substrate, the second source containing the silicon and an amino-group and having amino-group-containing ligand whose number is two or less in one molecule and not more than the number of halogen-group-containing ligand in one molecule of the first source, modifying the first layer, and forming a second layer consisting of silicon;
wherein in forming the second layer,
the amino-group-containing ligand is separated from a silicon atom in the second source,
an atom constituting the halogen-group is extracted from the first layer by causing a reaction between the separated ligand and an atom constituting the halogen-group in the first layer, and further
a bond between the silicon atom from which the ligand is separated in the second source and the silicon atom in the first layer is made without making a bond between the separated ligand and the silicon atom in the first layer.

15. A method of manufacturing a semiconductor device, comprising:
forming a thin film consisting of a metal element on a substrate by performing once or more a cycle comprising:
supplying a first source to the substrate, the first source containing the metal element and a halogen-group, and forming a first layer containing the metal element and the halogen-group, and
supplying a second source to the substrate, the second source containing the same metal element as the metal element in the first layer and an amino-group and having amino-group-containing ligand whose number is two or less in one molecule and not more than the number of halogen-group-containing ligand in one molecule of the first source, modifying the first layer, and forming a second layer consisting of the metal element;
wherein in forming the second layer,
the amino-group-containing ligand is separated from an atom of the metal element in the second source,
an atom constituting the halogen-group is extracted from the first layer by causing a reaction between the separated ligand and an atom constituting the halogen-group in the first layer, and further
a bond between the atom of the metal element from which the ligand is separated in the second source and the atom of the metal element in the first layer is made without making a bond between the separated ligand and the atom of the metal element in the first layer.

* * * * *